US 6,730,560 B2

(12) United States Patent
Ito

(10) Patent No.: US 6,730,560 B2
(45) Date of Patent: May 4, 2004

(54) METHOD FOR FABRICATING SEMICONDUCTOR DEVICE

(75) Inventor: Toyoji Ito, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/321,475

(22) Filed: Dec. 18, 2002

(65) Prior Publication Data

US 2003/0143804 A1 Jul. 31, 2003

(30) Foreign Application Priority Data

Jan. 31, 2002 (JP) ...................................... 2002-023406

(51) Int. Cl.⁷ ......................................... H01L 21/8242
(52) U.S. Cl. ......................... 438/250; 438/253; 438/393
(58) Field of Search ................................. 438/250, 393, 438/253, 251, 252, 394, 395, 396, 397, 398, 399, 249, 225; 257/99, 100; 428/690, 76, 917

(56) References Cited

U.S. PATENT DOCUMENTS

| 4,357,557 | A | * | 11/1982 | Inohara et al. ............... 313/509 |
| 5,432,732 | A | * | 7/1995 | Ohmi ........................... 365/149 |
| 5,494,840 | A | * | 2/1996 | Ohmi ........................... 438/253 |
| 5,497,937 | A | * | 3/1996 | Yoshikawa et al. ........... 228/205 |
| 5,709,065 | A | * | 1/1998 | Krause ............................ 53/400 |
| 5,771,562 | A | * | 6/1998 | Harvey et al. .............. 29/592.1 |
| 5,866,070 | A | * | 2/1999 | Watanabe et al. .............. 422/40 |
| 6,128,193 | A | * | 10/2000 | Moss et al. ................... 361/729 |
| 6,521,007 | B1 | * | 2/2003 | Tanaka et al. ............... 55/385.2 |
| 6,537,688 | B2 | * | 3/2003 | Silvernail et al. ............ 428/690 |
| 6,576,351 | B2 | * | 6/2003 | Silvernail .................... 428/690 |
| 6,590,157 | B2 | * | 7/2003 | Boroson et al. ............. 174/52.2 |
| 6,614,057 | B2 | * | 9/2003 | Silvernail et al. ............. 257/99 |

FOREIGN PATENT DOCUMENTS

| JP | 2001-60669 | | 3/2001 | |
| JP | 2002305076 | A * | 10/2002 | ........... H05B/33/04 |

OTHER PUBLICATIONS

"Effect of Mositure on Characteristics of Surface Mount Solid Tantalum Capacitors" Alexander Teverovsky NASA/GSFC.*

* cited by examiner

Primary Examiner—Carl Whitehead, Jr.
Assistant Examiner—Laura M Schillinger
(74) Attorney, Agent, or Firm—McDermott, Will & Emery

(57) ABSTRACT

First, a capacitor device including a capacitor dielectric film of a metal oxide is formed on a substrate. Subsequently, an interlayer insulating film of an oxide is deposited on the capacitor device, an opening is formed in a region of the interlayer insulating film disposed above the capacitor device, and then, a conducting film connected to the capacitor device through the opening is formed so as to expose a portion of the interlayer insulating film disposed above a periphery of the capacitor device. During a convey time when the substrate on which the conducting film has been formed is being conveyed to a subsequent step or during a wait time before or after conveying the substrate to the subsequent step, the substrate on which the conducting film has been formed is contained in a container an atmosphere within which has a lower moisture concentration than the ambient atmosphere until a substantially whole top face of the interlayer insulating film is covered with another member.

6 Claims, 12 Drawing Sheets

METHOD FOR FABRICATING SEMICONDUCTOR DEVICE

BACKGROUND OF THE INVENTION

The present invention relates to a method for fabricating a semiconductor device including a capacitor device using a ferroelectric or high dielectric of a metal oxide as a capacitor dielectric film.

A capacitor device including, as a capacitor dielectric film, a ferroelectric film or a high dielectric film made of a metal oxide has remnant polarization derived from its hysteresis characteristic and a high dielectric constant. Therefore, such a capacitor device has been used instead of a conventional capacitor device including a capacitor dielectric film of silicon oxide or silicon nitride in the field of nonvolatile memories and DRAMs.

In order to form a capacitor device on one semiconductor substrate (wafer), a plurality of fabrication procedures should be performed, and therefore, a semiconductor substrate under fabrication is generally contained in a plastic container during a convey time when the semiconductor substrate is being conveyed between a plurality of fabrication systems or a wait time before or after the conveyance.

The present inventor has found the following problem in a conventional method for fabricating a semiconductor device including a capacitor device using a ferroelectric or a high dielectric:

An interlayer insulating film formed between a capacitor device and an interconnect layer on a semiconductor substrate absorbs atmospheric moisture during the convey time or the wait time between one procedure and another subsequent procedure, and the absorbed moisture degrades the electric characteristic of the capacitor dielectric film. The cause of this problem will now be described.

FIG. 11 shows the dependency on the annealing temperature of the remnant polarization value and the breakdown voltage value of a conventional capacitor device including a ferroelectric as a capacitor dielectric film. In this case, with an interconnect formed above the capacitor device, an interlayer insulating film of silicon oxide obtained by causing a reaction between ozone ($O_3$) and TEOS (tetraethyl orthosilicate) at the atmospheric pressure (namely, ozone TEOS) is formed, and annealing is performed in an oxygen atmosphere at a temperature of 300° C., 350° C. or 400° C.

As is understood from FIG. 11, when the annealing is performed at 400° C., both the remnant polarization value and the breakdown voltage value are lowered.

FIG. 12 shows the dependency on the heating temperature of the concentration of moisture desorbed from silicon oxide obtained by thermal desorption spectroscopy (TDS). As is understood from FIG. 12, when the heating temperature for a semiconductor substrate exceeds 200° C., moisture desorbed from silicon oxide is observed, and the peak of the moisture concentration is found at 400° C. regardless of the substrate temperature.

These facts seem to reveal the following: The interlayer insulating film made of ozone TEOS absorbs the atmospheric moisture during the convey time or the wait time, and the absorbed moisture is easily desorbed and hence is reacted with the ferroelectric through the subsequently performed annealing, resulting in lowering the remnant polarization value.

On the other hand, however, in order to improve the yield and the reliability of a semiconductor device, it is necessary to perform annealing and form a protection film at a high temperature for recovering a damage caused in forming an interconnect and for preventing corrosion of aluminum.

SUMMARY OF THE INVENTION

The present invention was devised to overcome the above-described conventional problem, and an object is preventing the electric characteristic of a capacitor dielectric film including a ferroelectric of a metal oxide from being degraded by moisture desorbed from an interlayer insulating film through annealing.

In order to achieve the object, according to a method of this invention for fabricating a semiconductor device including a capacitor device having a capacitor dielectric film of a metal oxide, an interlayer insulating film of an oxide is prevented from including moisture during a convey time or a wait time before a subsequent step.

Specifically, the first method for fabricating a semiconductor device of this invention includes a first step of forming, on a substrate, a capacitor device including a capacitor dielectric film of a metal oxide; a second step of depositing an interlayer insulating film of an oxide on the capacitor device; and a third step of forming an opening in a region of the interlayer insulating film disposed above the capacitor device and forming, on the interlayer insulating film, a conducting film connected to the capacitor device through the opening in such a manner that a portion of the interlayer insulating film disposed above a periphery of the capacitor device is exposed, and during a convey time when the substrate on which the conducting film has been formed is being conveyed from the third step to a following forth step or during a wait time before or after conveying the substrate from the third step to the fourth step, the substrate on which the conducting film has been formed is contained in a container an atmosphere within which has a lower moisture concentration than the ambient atmosphere until a substantially whole top face of the interlayer insulating film is covered with another member.

In the first method for fabricating a semiconductor device, the amount of moisture absorbed from the air by the interlayer insulating film formed on the substrate during the convey time or the wait time is reduced. Therefore, even when annealing is performed in a subsequent step, the annealed interlayer insulating film minimally desorbs moisture, resulting in preventing electric characteristic degradation of the capacitor dielectric film derived from reduction or the like of the capacitor dielectric film including a ferroelectric or the like of a metal oxide.

In the first method for fabricating a semiconductor device, a barrier film made from the conducting film is preferably formed in the third step.

In this case, an interconnect formation film corresponding to the another member is preferably deposited over the interlayer insulating film including the conducting film in the fourth step.

In the first method for fabricating a semiconductor device, an interconnect made from the conducting film is preferably formed in the third step.

The first method for fabricating a semiconductor device preferably further includes, after the fourth step, a fifth step of performing annealing on the conducting film at a temperature of approximately 200° C. or more. Thus, annealing for recovering damage having been caused in patterning the capacitor dielectric film or the conducting film can be definitely performed.

In the first method for fabricating a semiconductor device, the interlayer insulating film is preferably made of silicon oxide.

In the first method for fabricating a semiconductor device, the conducting film is preferably a single-layer film made of one of or a multilayer film including at least two of titanium, titanium nitride, aluminum, tungsten and copper.

The second method for fabricating a semiconductor device of this invention includes a first step of forming, on a substrate, a capacitor device including a capacitor dielectric film of a metal oxide; a second step of forming a first interlayer insulating film on the capacitor device; a third step of forming, on the first interlayer insulating film, a first conducting film electrically connected to the capacitor device; a fourth step of forming a second interlayer insulating film of an oxide on the first interlayer insulating film including the first conducting film; and a fifth step of forming a second conducting film on a substantially whole top face of the second interlayer insulating film, and during a convey time when the substrate on which the second interlayer insulating film has been formed is being conveyed from the fourth step to the fifth step or during a wait time before or after conveying the substrate from the fourth step to the fifth step, the substrate on which the second interlayer insulating film has been formed is contained in a container an atmosphere within which has a lower moisture concentration than the ambient atmosphere.

In the second method for fabricating a semiconductor device, the amount of moisture absorbed from the air by the second interlayer insulating film formed on the substrate during the convey time or the wait time is reduced. Therefore, even when annealing is performed in a subsequent step, the annealed second interlayer insulating film minimally desorbs moisture, resulting in preventing electric characteristic degradation of the capacitor dielectric film derived from reduction or the like of the capacitor dielectric film including a ferroelectric or the like of a metal oxide.

The second method for fabricating a semiconductor device preferably further includes, after the fifth step, a sixth step of performing annealing on the second conducting film at a temperature of approximately 200° C. or more.

In the second method for fabricating a semiconductor device, the first interlayer insulating film or the second interlayer insulating film is preferably made of silicon oxide.

In the second method for fabricating a semiconductor device, each of the first conducting film and the second conducting film is preferably a single-layer film made of one of or a multilayer film including at least two of titanium, titanium nitride, aluminum, tungsten and copper.

The third method for fabricating a semiconductor device of this invention includes a first step of forming, on a substrate, a capacitor device including a capacitor dielectric film of a metal oxide; a second step of forming an interlayer insulating film of an oxide on the capacitor device; a third step of forming an interconnect of a conducting film on the interlayer insulating film; and a fourth step of forming a protection film of a nitride on a substantially whole top face of the interlayer insulating film including the interconnect, and during a convey time when the substrate on which the interlayer insulating film and the interconnect have been formed is being conveyed from the third step to the fourth step or during a wait time before or after conveying the substrate from the third step to the fourth step, the substrate on which the interlayer insulating film and the interconnect have been formed is contained in a container an atmosphere within which has a lower moisture concentration than the ambient atmosphere.

In the third method for fabricating a semiconductor device, the amount of moisture absorbed from the air by the interlayer insulating film formed on the substrate during the convey time or the wait time is reduced. Therefore, even when annealing is performed in a subsequent step, the annealed interlayer insulating film minimally desorbs moisture, resulting in preventing electric characteristic degradation of the capacitor dielectric film derived from reduction or the like of the capacitor dielectric film including a ferroelectric or the like of a metal oxide.

The third method for fabricating a semiconductor device preferably further includes, between the third step and the fourth step, a step of performing annealing on the interconnect at a temperature of approximately 200° C. or more.

In the third method for fabricating a semiconductor device, the interlayer insulating film is preferably made of silicon oxide.

In the third method for fabricating a semiconductor device, the protection film is preferably made of silicon nitride.

In the third method for fabricating a semiconductor device, the conducting film is preferably a single-layer film made of one of or a multilayer film including at least two of titanium, titanium nitride, aluminum, tungsten and copper.

The fourth method for fabricating a semiconductor device of this invention includes a step of forming, on a substrate, a capacitor device including a capacitor dielectric film of a metal oxide, and during a convey time when the substrate on which the capacitor device has been formed is being conveyed to a subsequent step following the step of forming a capacitor device or during a wait time before or after conveying the substrate from the step of forming a capacitor device to the subsequent step, the substrate on which the capacitor device has been formed is contained in a container an atmosphere within which has a lower moisture concentration than the ambient atmosphere.

In the fourth method for fabricating a semiconductor device, even when annealing is performed in a subsequent step, the electric characteristic of the capacitor dielectric film including a ferroelectric or the like of a metal oxide can be prevented from being degraded by moisture.

In any of the first through fourth methods for fabricating a semiconductor device, the container is preferably hermetically sealable and loaded with a moisture absorption material.

In this case, the moisture absorption material is preferably made of silica gel or active alumina.

In any of the first through fourth methods for fabricating a semiconductor device, the container is preferably hermetically sealable and filled with an inert gas or kept evacuated.

In this case, the inert gas is preferably nitrogen, argon or helium.

In any of the first through fourth methods for fabricating a semiconductor device, the metal oxide is preferably a layered perovskite composite oxide including bismuth or a perovskite composite oxide including lead, zirconium and titanium, or strontium and titanium.

DETAILED DESCRIPTION OF THE INVENTION

Embodiment 1

A method for fabricating a semiconductor device according to Embodiment 1 of the invention will now be described with reference to the accompanying drawings.

FIGS. 1A through 1C and 2A through 2C are schematic cross-sectional views for showing procedures in the method for fabricating a semiconductor device including a capacitor device having a capacitor dielectric film of a ferroelectric of this embodiment.

Capacitor Device Forming Step

Figure 1A:
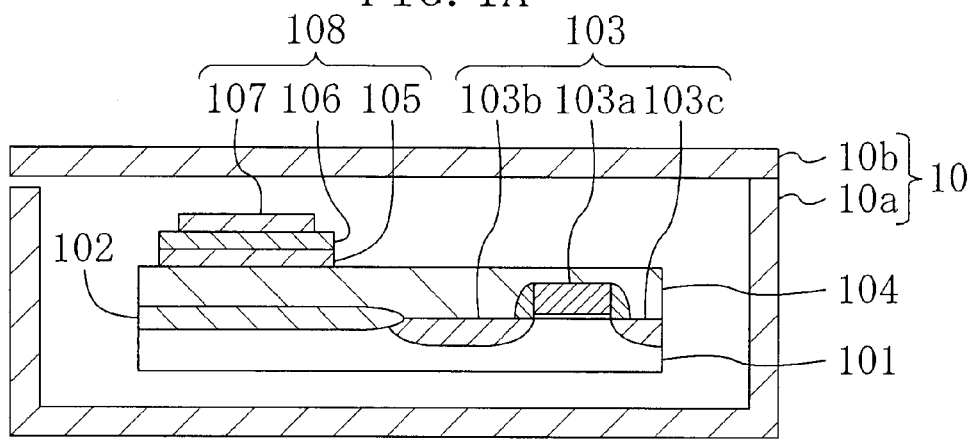
FIGS. 1A, 1B and 1C are schematic cross-sectional views for showing procedures in a method for fabricating a semiconductor device according to Embodiment 1 of the invention.

A capacitor device forming step shown in FIG. 1A will now be described.

First, in a transistor forming step prior to the capacitor device forming step, an isolation region 102 of a LOCOS film or the like is selectively formed in a wafer (semiconductor substrate) 101 of, for example, silicon (Si). Thereafter, in a device formation region on the wafer 101 partitioned by the isolation region 102, a MOS transistor 103 including a gate electrode 103a, a source region 103b and a drain region 103c is formed. Subsequently, a first interlayer insulating film 104 of silicon oxide ($SiO_2$) with a thickness of approximately 1500 nm is deposited over the wafer 101 including the isolation region 102 and the MOS transistor 103 by, for example, chemical vapor deposition (CVD). Then, the top face of the first interlayer insulating film 104 is planarized by what is called resist etch back in which the first interlayer insulating film 104 is etched back with a resist material applied (spin coated) over the irregular top face of the first interlayer insulating film 104.

Next, a lower electrode formation film of platinum (Pt) with a thickness of approximately 200 nm is deposited on the planarized first interlayer insulating film 104 by, for example, spattering. Thereafter, a ferroelectric film of a metal oxide including strontium (St), bismuth (Bi) and tantalum (Ta) with a thickness of approximately 200 nm is deposited on the lower electrode formation film by, for example, the CVD, and an upper electrode formation film of platinum with a thickness of approximately 200 nm is deposited on the ferroelectric film. Subsequently, portions of the upper electrode formation film, the ferroelectric film and the lower electrode formation film disposed above the isolation region 102 are selectively and successively patterned by lithography and dry etching, thereby forming a lower electrode 105 from the lower electrode formation film, a capacitor dielectric film 106 from the ferroelectric film and an upper electrode 107 from the upper electrode formation film. In this manner, a capacitor device 108 composed of the lower electrode 105, the capacitor dielectric film 106 and the upper electrode 107 is obtained. Although merely one MOS transistor 103 and one capacitor device 108 are herein shown on the wafer 101 for convenience, a plurality of MOS transistors 103 and a plurality of capacitor devices 108 are actually formed on the wafer 101. Subsequently, the capacitor device 108 is annealed in an oxygen atmosphere at a temperature of approximately 800° C., so as to recover damage of the capacitor dielectric film 106 having been caused by the dry etching in patterning the capacitor device 108. Thereafter, during a convey time when the wafer 101 is being conveyed to a fabrication system used for a subsequent step or a wait time before or after the conveyance, the wafer 101 on which the capacitor device 108 has been formed is contained in a conventional first container 10 of plastic, which is not sufficiently cut off from the outside atmosphere (the air), namely, which is not hermetically sealed. The first container 10 herein includes a container body 10a and a roof 10b.

In general, the capacitor device forming step includes a variety of processing, and also during the convey time or the wait time between these various processing, the wafer need not be contained in a container of the present invention but may be contained in the conventional first container 10.

Barrier Formation Film Depositing Step

Figure 1B:
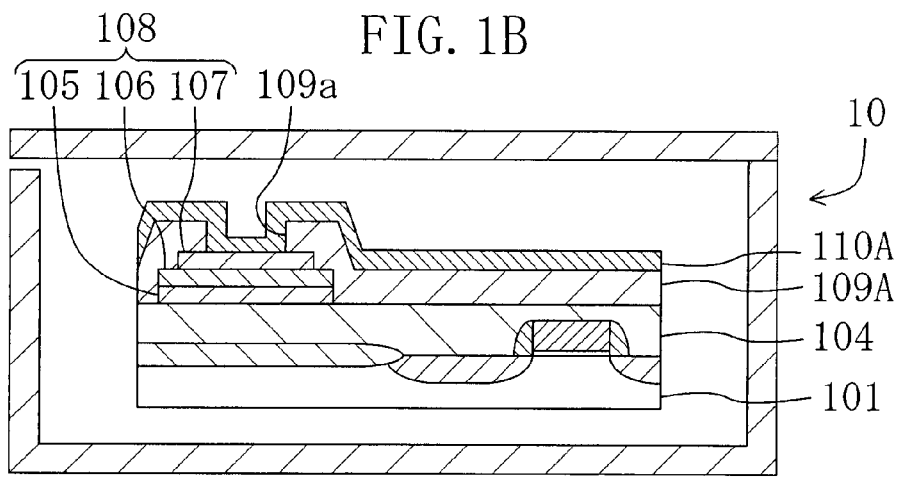

Next, in a barrier formation film depositing step, the wafer 101 on which the capacitor device 108 has been formed is taken out from the first container 101. Thereafter, as shown in FIG. 1B, a second interlayer insulating film 109A of silicon oxide including approximately 5% of phosphorus (P) (i.e., PSG) with a thickness of approximately 500 nm is deposited over the first interlayer insulating film 104 including the capacitor device 108 by atmospheric pressure CVD. Subsequently, a first contact hole 109a is formed in a portion of the second interlayer insulating film 109A disposed on the upper electrode 107 of the capacitor device 108 by the lithography and the dry etching. Thereafter, the annealing is performed in an oxygen atmosphere at a temperature of approximately 800° C., so as to recover damage of the capacitor dielectric film 106 having been caused by hydrogen ions generated during the deposition of the second interlayer insulating film 109A and caused by the dry etching in forming the first contact hole 109a. Subsequently, a barrier formation film 110A of titanium nitride (TiN) with a thickness of approximately 50 nm is deposited over the second interlayer insulating film 109A including the bottom and the wall of the first contact hole 109a. Thereafter, the wafer 101 on which the barrier formation film 110A has been deposited is contained in the first container 10 to be conveyed to a subsequent step.

In general, the barrier formation film depositing step includes a variety of processing, and also during the convey time or the wait time between these various processing, the wafer need not be contained in the container of the present invention but may be contained in the conventional first container 10.

Barrier Film Forming Step

Figure 1C:
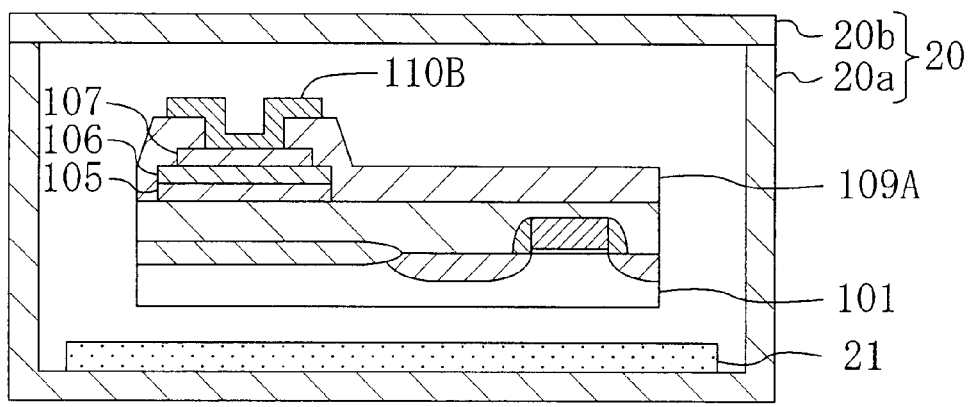

Next, in a barrier film forming step, the wafer 101 on which the barrier formation film 110A has been deposited is taken out from the first container 10. Thereafter, as shown in FIG. 1C, the barrier formation film 110A is patterned so as to allow a portion thereof including the first contact hole 109a to remain, thereby forming, from the barrier formation film 110A, a barrier film 110B that is electrically connected to the upper electrode 107 and protects the capacitor dielectric film 106. Subsequently, the wafer 101 on which the second interlayer insulating film 109A and the barrier film 110B have been formed is contained in a second container 20. At this point, the second container 20 includes a container body 20a and a roof 20b made of quartz to be hermetically sealable. After containing the wafer 101, the contact faces between the container body 20a and the roof 20b are adhered to each other with a vacuum grease material for cutting off from the air. Furthermore, approximately 100 g of a moisture absorption material 21 of a silica gel that includes approximately 70% of pores and has been dried at a temperature of approximately 1200° C. is loaded in the second container 20, and the wafer is thus conveyed to a subsequent step.

In general, the barrier film forming step includes a variety of processing, and also during the convey time and the wait time between these various processing, namely, after the face of the second interlayer insulating film 109A is exposed by patterning the barrier film 110B, the wafer 101 needs to be contained in the second container 20 of this invention.

Interconnect Formation Film Depositing Step

Figure 2A:
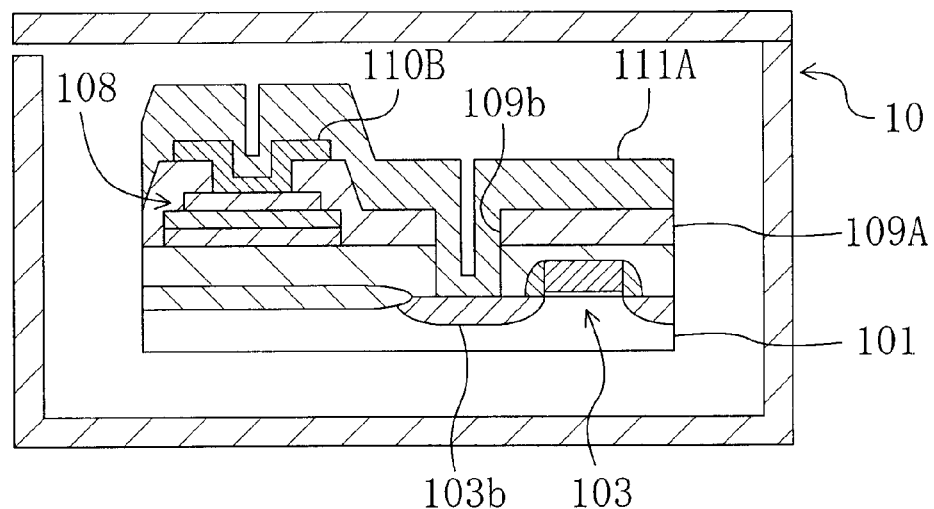
FIGS. 2A, 2B and 2C are schematic cross-sectional views for showing other procedures in the method for fabricating a semiconductor device of Embodiment 1.

Next, in an interconnect formation film depositing step, the wafer 101 on which the barrier film 110B has been formed is taken out from the second container 20. Thereafter, as shown in FIG. 2A, a second contact hole 109b is formed in portions of the first interlayer insulating film 104 and the second interlayer insulating film 109A disposed above the source region 103b of the MOS transistor 103 by the lithography and the dry etching. Subsequently, titanium (Ti) with a thickness of approximately 20 nm, titanium nitride (TiN) with a thickness of approximately 100 nm, aluminum (Al) with a thickness of approximately 700 nm and titanium nitride (TiN) with a thickness of approximately 50 nm are successively deposited over the second interlayer insulating film 109A including the bottom and the wall of the second contact hole 109b and the barrier film 110B by the sputtering. Thus, an interconnect formation film 111A with a four-layered structure in which the metal films and the metal nitride films are thus stacked is formed. Thereafter, the wafer 101 on which the interconnect formation film 111A has been deposited is contained in the first container 10 to be conveyed to a subsequent step.

In general, the interconnect formation film depositing step includes a variety of processing, and also during the convey time or the wait time between these various processing, namely, before completing the deposition of the interconnect formation film 111A, the wafer 101 needs to be contained in the second container 20.

Interconnect Forming Step

Figure 2B:
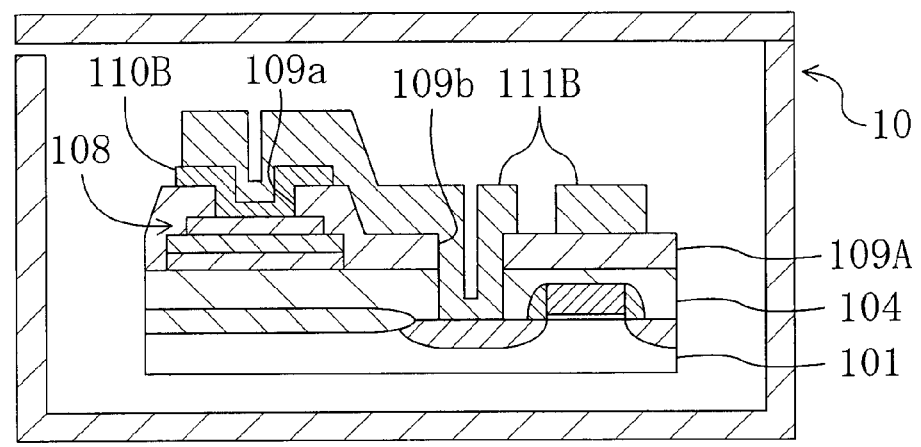

Next, in an interconnect forming step, the wafer 101 on which the interconnect formation film 111A has been deposited is taken out from the first container 10. Thereafter, as shown in FIG. 2B, the interconnect formation film 111A is patterned by the dry etching so as to allow a portion thereof including the first contact hole 109a and the second contact hole 109b to remain, thereby forming an interconnect 111B from the interconnect formation film 111A. Thereafter, the annealing is performed in an oxygen atmosphere at a temperature of approximately 450° C., so as to recover damage of the capacitor dielectric film 106 having been caused in depositing and patterning the interconnect formation film 111A. Through this annealing, remaining chloride included in an etching gas used for the dry etching of the interconnect formation film 111A is vaporized, and therefore, corrosion of the aluminum included in the interconnect 111B can be also prevented. Thereafter, the wafer 101 on which the interconnect 111B has been formed is contained in the first container 10 to be conveyed to a subsequent step.

In general, the interconnect forming step includes a variety of processing, and also during the convey time or the wait time between these various processing, the wafer need not be contained in the container of the present invention but may be contained in the conventional first container 10.

Protection Film Depositing Step

Figure 2C:
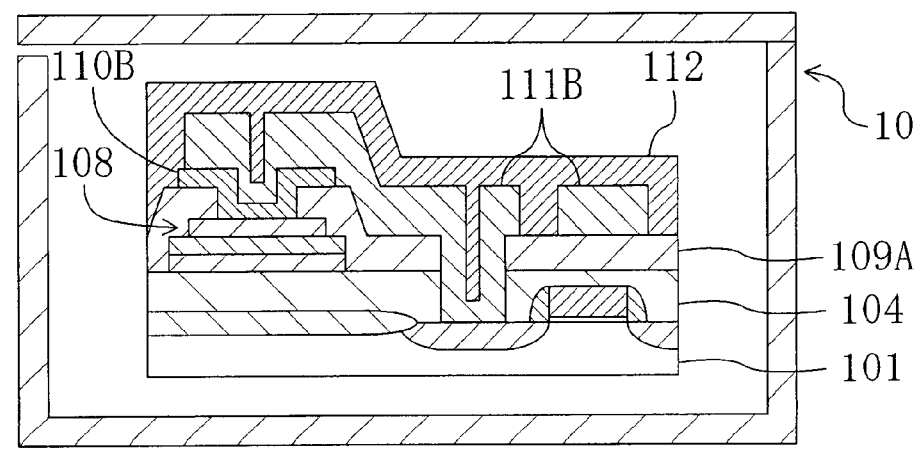

Next, in a protection film depositing step, the wafer 101 on which the interconnect 111B has been formed is taken out from the first container 10. Thereafter, as shown in FIG. 2C, a protection (passivation) film 112 of silicon nitride with a thickness of approximately 800 nm is deposited over the second interlayer insulating film 109A including the interconnect 111B by plasma CVD in which, for example, silane is used as a material and the substrate temperature is set to approximately 400° C. Thereafter, the wafer 101 on which the protection film 112 has been deposited is contained in the first container 10 to be conveyed to a subsequent step. Subsequently, although not shown in the drawings, a desired pad is formed in the protection film 112.

In general, the protection film depositing step includes a variety of processing, and also during the convey time or the wait time between these various processing, the wafer need not be contained in the container of the present invention but may be contained in the conventional first container 10.

As described so far, according to Embodiment 1 of the invention, during the convey time when the wafer is being conveyed from the barrier film forming step to the interconnect formation film depositing step or the wait time before or after this conveyance, the wafer 101 is contained in the hermetically sealed second container 20 loaded with the moisture absorption material 21 as shown in FIG. 1C. Therefore, the exposed portion of the second interlayer insulating film 109A of silicon oxide is never exposed to the air before depositing the interconnect formation film 111A. Accordingly, the moisture absorbing function of the second interlayer insulating film 109A can be suppressed during the convey time or the wait time of the water 101. As a result, the capacitor dielectric film 106 of the capacitor device 108 can be prevented from being damaged by moisture desorbed from the second interlayer insulating film 109 through the annealing performed in an oxygen atmosphere at a temperature of approximately 450° C. in the interconnect forming step.

The second container 20 may be used not only between the barrier film forming step and the interconnect formation film depositing step but also between other steps.

Also, the barrier film 110B electrically connected to the upper electrode 107 of the capacitor device 108 is formed not only in the portion above the capacitor device 108 but also in a portion below the interconnect 111A.

The hermetically sealed second container 20 loaded with the moisture absorption material 21 is thus used during the convey time or the wait time between the barrier film forming step and the interconnect formation film depositing step. Accordingly, the breakdown voltage of the capacitor device 108 fabricated in this embodiment is increased from 15 V to 20 V as compared with that of a conventional capacitor device. Also, it has been confirmed that the retention characteristic thereof is increased by one figure.

Modification of Embodiment 1

A method for fabricating a semiconductor device according to a modification of Embodiment 1 of the invention will now be described with reference to the accompanying drawing.

Figure 3:
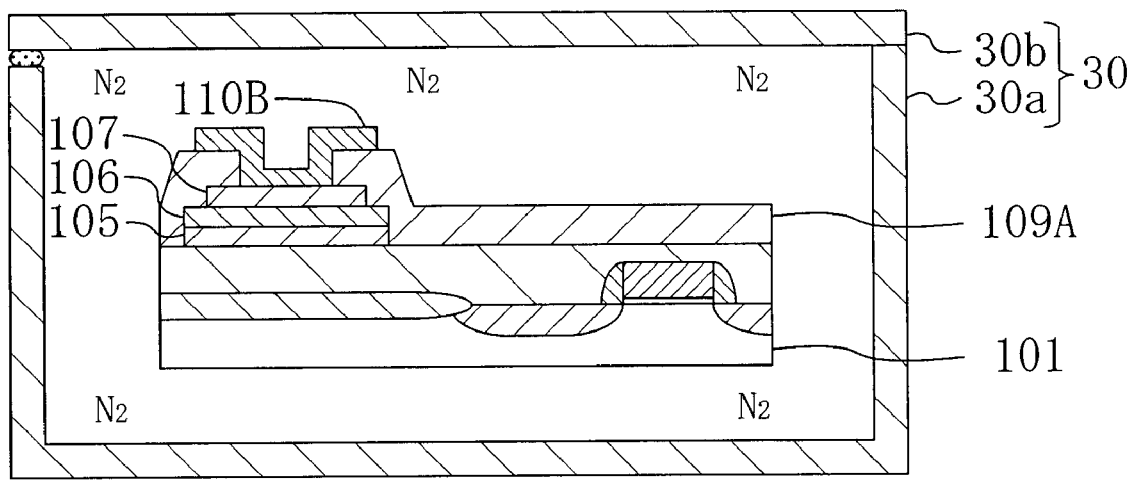
FIG. 3 is a schematic cross-sectional view for showing a procedure in a method for fabricating a semiconductor device according to a modification of Embodiment 1.

FIG. 3 is a schematic cross-sectional view for showing a procedure in the method for fabricating a semiconductor device including a capacitor device having a capacitor dielectric film of a ferroelectric according to the modification of Embodiment 1. Herein, a difference from Embodiment 1 alone will be described. In FIG. 3, like reference numerals are used to refer to like elements shown in FIG. 1C so as to omit the description.

Barrier Film Forming Step

As shown in FIG. 3, after taking out, from the first container 10, the wafer 101 on which the barrier formation film 110A has been formed, the barrier formation film 110A is patterned so as to allow a portion thereof including the first contact hole 109a to remain, thereby forming, from the barrier formation film 110A, the barrier film 110B that is electrically connected to the upper electrode 107 and protects the capacitor dielectric film 106. Subsequently, the wafer 101 on which the second interlayer insulating film 109A and the barrier film 110B have been formed is contained in a third container 30. At this point, the third container 30 includes a container body 30a and a roof 30b made of aluminum to be hermetically sealable, and although not shown in the drawing, the container body 30a is provided with a gas supply valve and a gas exhaust valve. After containing the wafer 101, the atmosphere within the third container 30 is replaced with a nitrogen ($N_2$) gas at a pressure of approximately 700×133.322 Pa (=700 Torr), which is lower than the atmospheric pressure. Furthermore, the contact faces between the container body 30a and the roof 30b are hermetically sealed by adhering to each other with a silicon rubber material coated with vacuum grease. Thereafter, the wafer 101 is conveyed to the subsequent step, that is, the interconnect formation film depositing step.

In this manner, according to this modification, during the convey time or the wait time between the barrier film forming step and the interconnect formation film depositing step, the third container 30 filled with the nitrogen gas is used. Therefore, the exposed portion of the second interlayer insulating film 109A of silicon oxide is never exposed to the air. As a result, it has been confirmed that the breakdown voltage of the capacitor device 108 fabricated in this modification is increased from 15 V to 22 V and that its retention characteristic is also increased by two figures.

Thus, the capacitor dielectric film 106 can be prevented from being damaged by moisture desorbed from the second interlayer insulating film 109A through the annealing performed in an oxygen atmosphere at a temperature of approximately 450° C. in the interconnect forming step.

The barrier film forming step includes a variety of processing, and also during the convey time or the wait time between the various processing carried out after the formation of the barrier film 110B until the deposition of the interconnect formation film 111A, the wafer 101 needs to be contained in the third container 30.

Embodiment 2

A method for fabricating a semiconductor device according to Embodiment 2 of the invention will now be described with reference to the accompanying drawings.

FIGS. 4A through 4C, 5A through 5C, 6A and 6B are schematic cross-sectional views for showing procedures in the method for fabricating a semiconductor device including a capacitor device having a capacitor dielectric film of a ferroelectric according to Embodiment 2. In this embodiment, like reference numerals are used to refer to like elements described in Embodiment 1.

Capacitor Device Forming Step

Figure 4A:
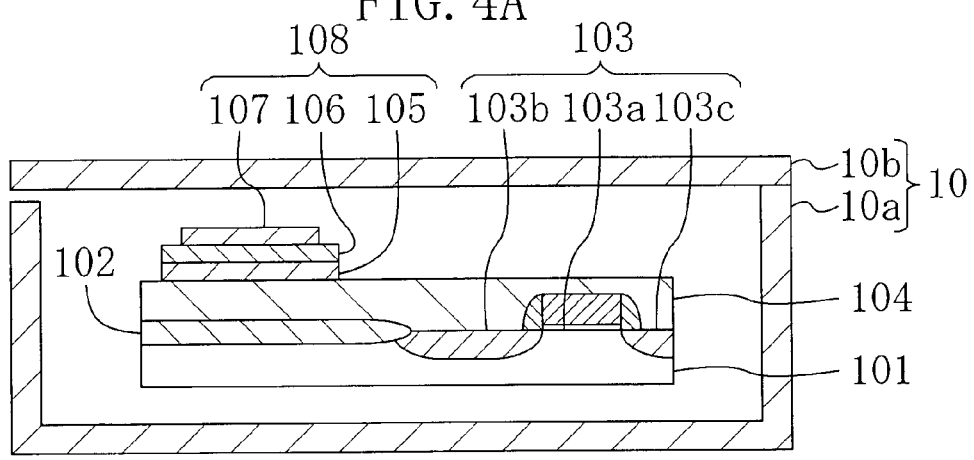
FIGS. 4A, 4B and 4C are schematic cross-sectional views for showing procedures in a method for fabricating a semiconductor device according to Embodiment 2 of the invention.

A capacitor device forming step shown in FIG. 4A will now be described.

First, in a transistor forming step prior to the capacitor device forming step, an isolation region 102 of a LOCOS film or the like is selectively formed in a wafer 101 of, for example, silicon. Thereafter, in a device formation region on the wafer 101 partitioned by the isolation region 102, a MOS transistor 103 including a gate electrode 103a, a source region 103b and a drain region 103c is formed. Subsequently, a first interlayer insulating film 104 of silicon oxide with a thickness of approximately 1500 nm is deposited over the wafer 101 including the isolation region 102 and the MOS transistor 103 by, for example, the CVD. Then, with a resist material applied on the irregular top face of the first interlayer insulating film 104, the top face of the first interlayer insulating film 104 is planarized by the resist etch back.

Next, a lower electrode formation film of platinum with a thickness of approximately 200 nm is deposited on the planarized first interlayer insulating film 104 by, for example, the spattering. Thereafter, a ferroelectric film of a metal oxide including strontium, bismuth and tantalum with a thickness of approximately 200 nm is deposited on the lower electrode formation film by, for example, the CVD, and an upper electrode formation film of platinum with a thickness of approximately 200 nm is deposited on the ferroelectric film. Subsequently, portions of the upper electrode formation film, the ferroelectric film and the lower electrode formation film disposed above the isolation region 102 are selectively and successively patterned by the lithography and the dry etching, thereby forming a lower electrode 105 from the lower electrode formation film, a capacitor dielectric film 106 from the ferroelectric film and an upper electrode 107 from the upper electrode formation film. In this manner, a capacitor device 108 composed of the lower electrode 105, the capacitor dielectric film 106 and the upper electrode 107 is obtained. Although merely one MOS transistor 103 and one capacitor device 108 are shown on the wafer 101 also in Embodiment 2, a plurality of MOS transistors 103 and a plurality of capacitor devices 108 are actually formed on the wafer 101. Subsequently, the capacitor device 108 is annealed in an oxygen atmosphere at a temperature of approximately 800° C., so as to recover damage of the capacitor dielectric film 106 having been caused by the dry etching in patterning the capacitor device 108. Thereafter, during a convey time when the wafer 101 is being conveyed to a fabrication system used for a subsequent step or a wait time before or after the conveyance, the wafer 101 on which the capacitor device 108 has been formed is contained in a conventional first container 10 of plastic, which is not sufficiently cut off from the outside atmosphere (the air).

In general, the capacitor device forming step includes a variety of processing, and also during the convey time or the wait time between these various processing, the wafer need not be contained in a container of the present invention but may be contained in the conventional first container 10.

Barrier Formation Film Depositing Step

Figure 4B:
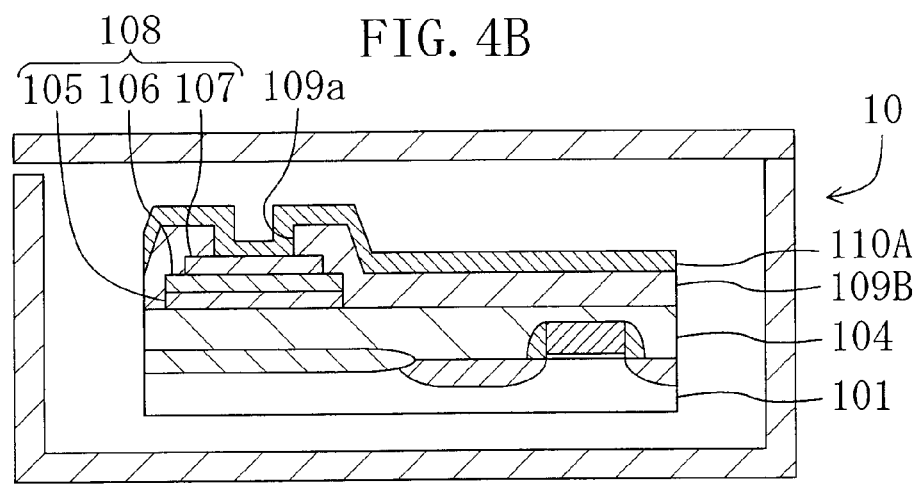

Next, in a barrier formation film depositing step, the wafer 101 on which the capacitor device 108 has been formed is taken out from the first container 101. Thereafter, as shown in FIG. 4B, a second interlayer insulating film 109B of silicon oxide with a thickness of approximately 500 nm is deposited over the first interlayer insulating film 104 including the capacitor device 108 by the CVD. Subsequently, a first contact hole 109a is formed in a portion of the second interlayer insulating film 109B disposed on the upper electrode 107 of the capacitor device 108 by the lithography and the dry etching. Thereafter, the annealing is performed in an oxygen atmosphere at a temperature of approximately 800° C., so as to recover damage of the capacitor dielectric film 106 having been caused by hydrogen ions generated during the deposition of the second interlayer insulating film 109B and caused by the dry etching in forming the first contact hole 109a. Subsequently, a barrier formation film 110A of titanium nitride with a thickness of approximately 50 nm is deposited over the second interlayer insulating film 109B including the bottom and the wall of the first contact hole 109a. Thereafter, the wafer 101 on which the barrier formation film 110A has been deposited is contained in the first container 10 to be conveyed to a subsequent step.

In general, the barrier formation film depositing step includes a variety of processing, and also during the convey time or the wait time between these various processing, the wafer need not be contained in the container of the present invention but may be contained in the conventional first container 10.

Barrier Film Forming Step and First Interconnect Formation Film Depositing Step

Figure 4C:
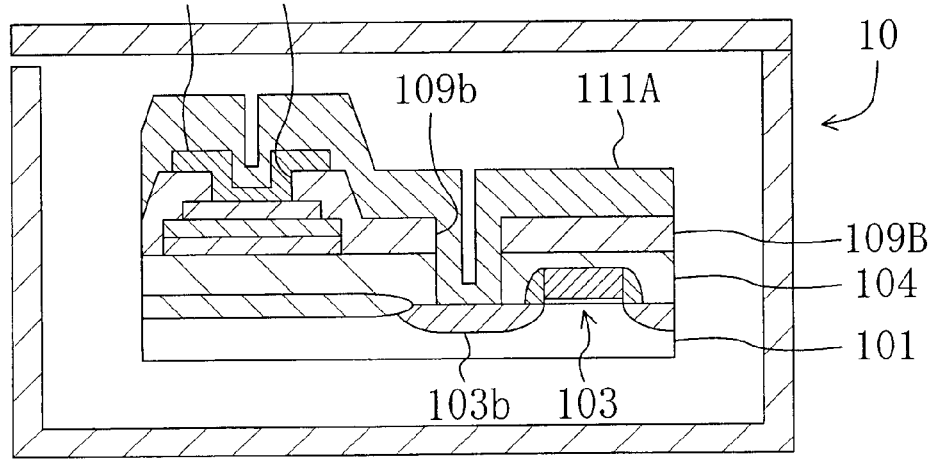

Next, the wafer 101 on which the barrier formation film 110A has been deposited is taken out from the first container 10. Thereafter, as shown in FIG. 4C, the barrier formation film 110A is patterned so as to allow a portion thereof including the first contact hole 109a to remain, thereby forming, from the barrier formation film 110A, a barrier film 110B that is electrically connected to the upper electrode 107 and protects the capacitor dielectric film 106. Subsequently, the wafer 101 on which the second interlayer insulating film 109B and the barrier film 110B have been formed is contained in the first container 10 to be conveyed to a subsequent step.

In a subsequent first interconnect formation film depositing step, after taking out the wafer 101 from the first container 10, a second contact hole 109b is formed in portions of the first interlayer insulating film 104 and the second interlayer insulating film 109B disposed above the source region 103b of the MOS transistor 103 by the lithography and the dry etching. Subsequently, titanium with a thickness of approximately 20 nm, titanium nitride with a thickness of approximately 100 nm, aluminum with a thickness of approximately 700 nm and titanium nitride with a thickness of approximately 50 nm are successively deposited over the second interlayer insulating film 109B including the bottom and the wall of the second contact hole 109b and the barrier film 110B by the sputtering. Thus, a first interconnect formation film 111A with a four-layered structure in which the metal films and the metal nitride films are thus stacked is formed. Thereafter, the wafer 101 on which the first interconnect formation film 111A has been deposited is contained in the first container 10 to be conveyed to a subsequent step.

In general, the barrier film forming step and the first interconnect formation film depositing step respectively include a variety of processing, and also during the convey time or the wait time between these processing, the wafer need not be contained in the container of the present invention but may be contained in the conventional first container 10.

Interconnect Forming Step

Figure 5A:
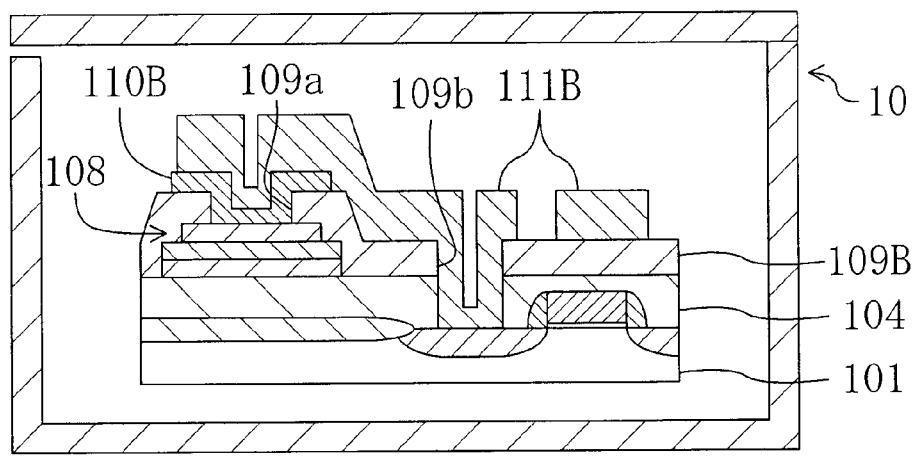
FIGS. 5A, 5B and 5C are schematic cross-sectional views for showing other procedures in the method for fabricating a semiconductor device of Embodiment 2.

Next, in an interconnect forming step, the wafer 101 on which the first interconnect formation film 111A has been deposited is taken out from the first container 10. Thereafter, as shown in FIG. 5A, the first interconnect formation film 111A is patterned by the dry etching so as to allow a portion thereof including the first contact hole 109a and the second contact hole 109b to remain, thereby forming a first interconnect 111B from the first interconnect formation film 111A. Thereafter, the annealing is performed in an oxygen atmosphere at a temperature of approximately 450° C., so as to recover damage of the capacitor dielectric film 106 having been caused in depositing and patterning the first interconnect formation film 111A. Through this annealing, remaining chloride included in an etching gas used for the dry etching of the first interconnect formation film 111A is vaporized, and therefore, corrosion of the aluminum included in the first interconnect 111B can be also prevented. Thereafter, the wafer 101 on which the first interconnect 111B has been formed is contained in the first container 10 to be conveyed to a subsequent step.

In general, the interconnect forming step includes a variety of processing, and also during the convey time or the wait time between these various processing, the wafer need not be contained in the container of the present invention but may be contained in the conventional first container 10.

Third Interlayer Insulating Film Depositing Step

Figure 5B:
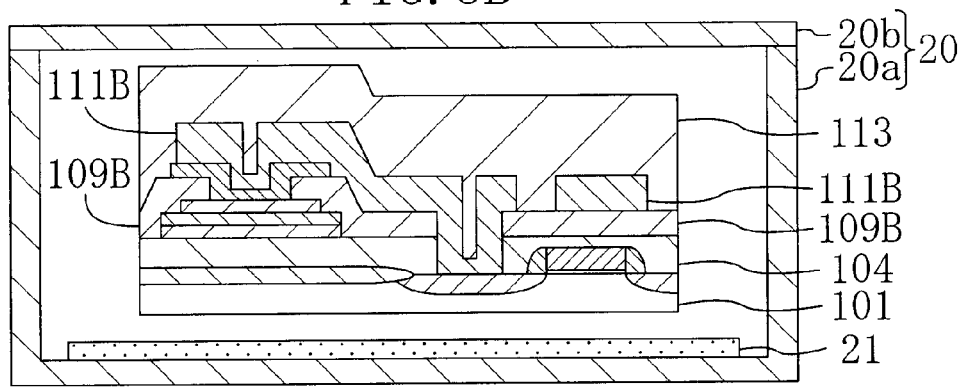

Next, in a third interlayer insulating film depositing step, the wafer 101 on which the first interconnect 111B has been formed is taken out from the first container 10. Thereafter, as shown in FIG. 5B, a third interlayer insulating film 113 of silicon oxide with a thickness of approximately 1500 nm is deposited over the second interlayer insulating film 109B including the first interconnect 111B by the atmospheric pressure CVD in which TEOS is allowed to react with ozone, that is, an oxidant. Thereafter, the wafer 101 on which the third interlayer insulating film 113 has been deposited is contained in a second container 20 made of quarts to be hermetically sealable. In the second container 20, after containing the wafer 101, the contact faces between a container body 20a and a roof 20b are adhered to each other with a vacuum grease material so as to be cut off from the air. Furthermore, the second container 20 is loaded with approximately 100 g of a moisture absorption material 21 that includes approximately 70% of pores and has been dried at a temperature of approximately 1200° C., and thus, the wafer 101 is conveyed to a subsequent step.

In general, the third interlayer insulating film depositing step includes a variety of processing, and also during the convey time or the wait time between these various processing, namely, after completing the deposition of the third interlayer insulating film 113, the wafer 101 needs to be contained in the second container 20 of the present invention.

Third Interlayer Insulating Film Forming Step

Figure 5C:
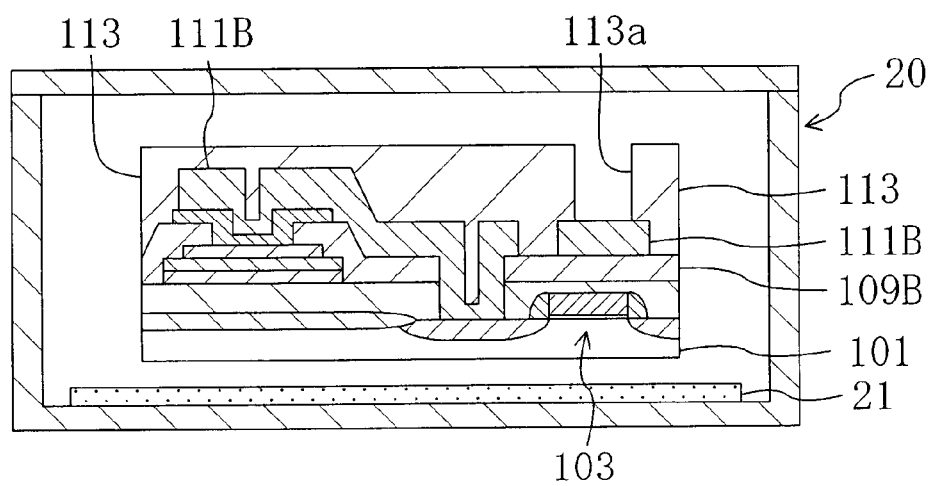

Next, in a third interlayer insulating film forming step, the wafer 101 on which the third interlayer insulating film 113 has been deposited is taken out from the second container 20. Thereafter, as shown in FIG. 5C, the top face of the third interlayer insulating film 113 is planarized by the resist etch back. Subsequently, a third contact hole 113a is selectively formed in the planarized third interlayer insulating film 113 by the lithography and the etching so as to expose a portion of the first interconnect 111B disposed above the MOS transistor 103. Thereafter, the wafer 101 on which the third contact hole 113a has been formed is contained in the second container 20 to be conveyed to a subsequent step.

Also during the convey time or the wait time between the planarization of the third interlayer insulating film and the formation of the contact hole, the wafer 101 is contained in the second container 20.

The third interlayer insulating film forming step includes a variety of processing, and during the convey time or the wait time between these various processing, the wafer 101 needs to be contained in the second container 20 of the present invention.

Second Interconnect Formation Film Depositing Step

Figure 6A:
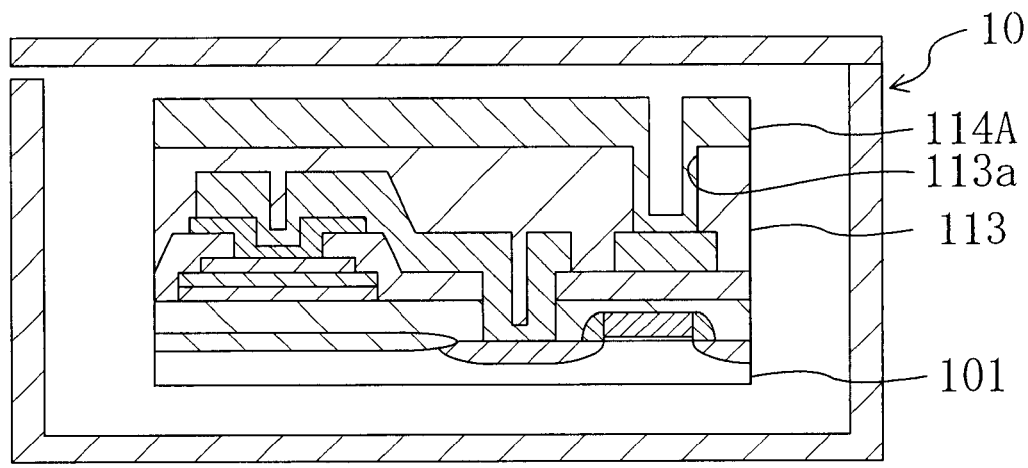
FIGS. 6A and 6B are schematic cross-sectional views for showing other procedures in the method for fabricating a semiconductor device of Embodiment 2.

Next, in a second interconnect formation film depositing step, the wafer 101 on which the third contact hole 113a has been formed in the third interlayer insulating film 113 is taken out from the second container 20. Thereafter, as shown in FIG. 6A, titanium (Ti) with a thickness of approximately 50 nm, aluminum (Al) with a thickness of approximately 700 nm and titanium nitride (TiN) with a thickness of approximately 50 nm are successively deposited over the third interlayer insulating film 113 including the bottom and the wall of the third contact hole 113a by the sputtering. Thus, a second interconnect formation film 114A with a three-layered structure in which the metal films and the metal nitride film are thus stacked is formed. Thereafter, the wafer 101 on which the second interconnect formation film 114A has been deposited is contained in the first container 10 to be conveyed to a subsequent step.

In general, the second interconnect formation film depositing step includes a variety of processing, and also during the convey time or the wait time between these various processing, namely, before completing the deposition of the second interconnect formation film 114A, the wafer 101 needs to be contained in the second container 20.

Second Interconnect Forming Step and Protection Film Depositing Step

Figure 6B:
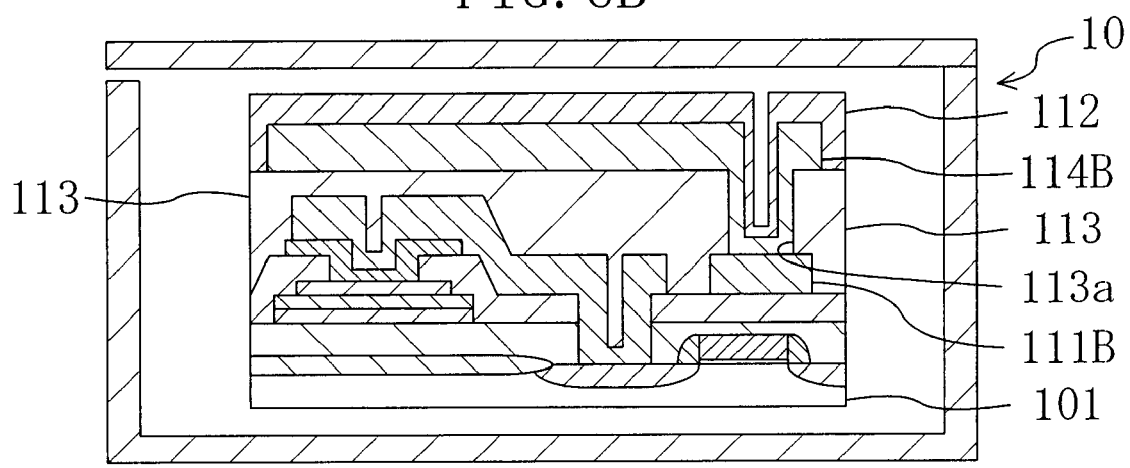

Next, in a second interconnect forming step, the wafer 101 on which the second interconnect formation film 114A has been deposited is taken out from the first container 10. Thereafter, as shown in FIG. 6B, the second interconnect formation film 114A is patterned by the lithography and the dry etching so as to allow a portion thereof including the third contact hole 113a to remain, thereby forming, from the second interconnect formation film 114A, a second interconnect 114B electrically connected to the first interconnect 111B through the third contact hole 113a. Thereafter, the annealing is performed in a nitrogen atmosphere at a temperature of approximately 400° C. Thus, remaining chloride included in an etching gas used in the dry etching of the second interconnect formation film 114A is vaporized, and hence, the corrosion of the aluminum included in the second interconnect 114B can be also prevented. Thereafter, a protection film 112 of silicon nitride with a thickness of approximately 800 nm is deposited over the third interlayer insulating film 113 including the second interconnect 114B by the plasma CVD in which silane is used as a material and the substrate temperature is set to approximately 400° C. Thereafter, the wafer 101 on which the protection film 112 has been deposited is contained in the first container 10 to be conveyed to a subsequent step. Subsequently, although not shown in the drawings, a desired pad is formed in the protection film 112 in the subsequent step. Also at this point, the wafer 101 is contained in the first container 10 during the convey time or the wait time between the second interconnect forming step and the protection film depositing step.

In general, the second interconnect forming step and the protection film depositing step respectively include a variety of processing, and also during the convey time or the wait time between these various processing, the wafer need not be contained in the container of the present invention but may be contained in the conventional first container 10.

As described so far, according to Embodiment 2 of the invention, during the convey time when the wafer is being conveyed from the third interlayer insulating film depositing step to the second interconnect formation film depositing step or the wait time before or after this conveyance, the wafer 101 is contained in the hermetically sealed second container 20 loaded with the moisture absorption material 21 as shown in FIGS. 5B and 5C. Therefore, the exposed portion of the third interlayer insulating film 113 of silicon oxide is never exposed to the air before depositing the second interconnect formation film 114A. As a result, the capacitor dielectric film 106 can be prevented from being damaged by moisture desorbed from the second interlayer insulating film 109B through the annealing performed in a nitrogen atmosphere at a temperature of approximately 400° C. in the second interconnect forming step.

In addition, in Embodiment 2, the so-called ozone TEOS film with good coverage is used as the third interlayer insulating film 113, and the ozone TEOS film has a high moisture absorbing property among silicon oxides. Therefore, it is very effective to suppress the moisture absorbing function of the third interlayer insulating film 113 during the convey time or the wait time of the wafer 101.

The second container 20 may be used not only between the third interlayer insulating film depositing step and the second interconnect formation film depositing step but also between other steps.

Also, the barrier film 110B electrically connected to the upper electrode 107 of the capacitor device 108 is formed not only in the portion above the capacitor device 108 but also in a portion below the first interconnect 111A.

As compared with a conventional technique where the hermetically sealed second container 20 loaded with the moisture absorption material 21 is not used during the convey time or the wait time, the remnant polarization value of the capacitor device 108 fabricated in this embodiment has been confirmed to increase from approximately 12 $\mu C/cm^2$ to approximately 14 $\mu C/cm^2$. Also, it has been confirmed that its retention characteristic is increased by one figure.

Modification of Embodiment 2

A method for fabricating a semiconductor device according to a modification of Embodiment 2 of the invention will now be described with reference to the accompanying drawings.

Figure 7A:
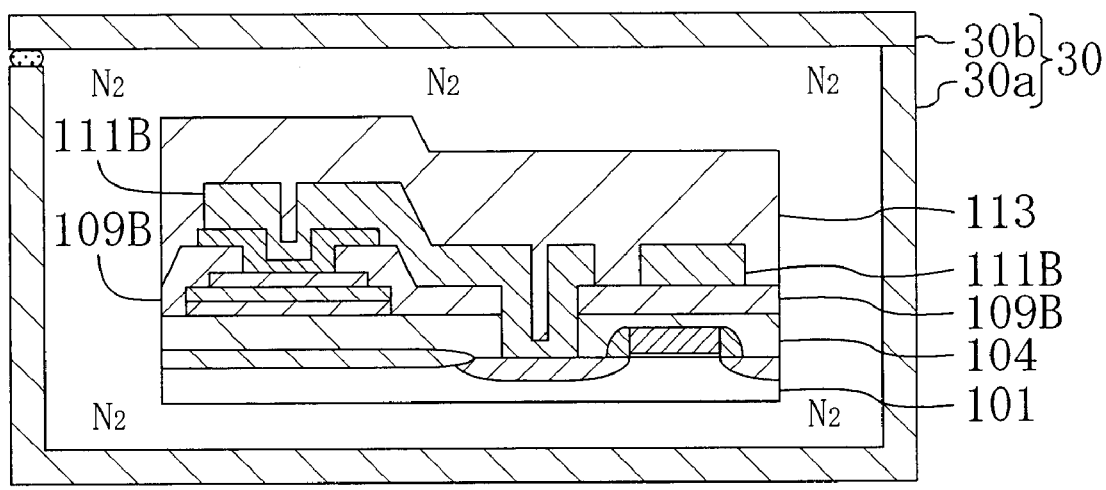
FIGS. 7A and 7B are schematic cross-sectional views for showing procedures in a method for fabricating a semiconductor device according to a modification of Embodiment 2.
Figure 7B:
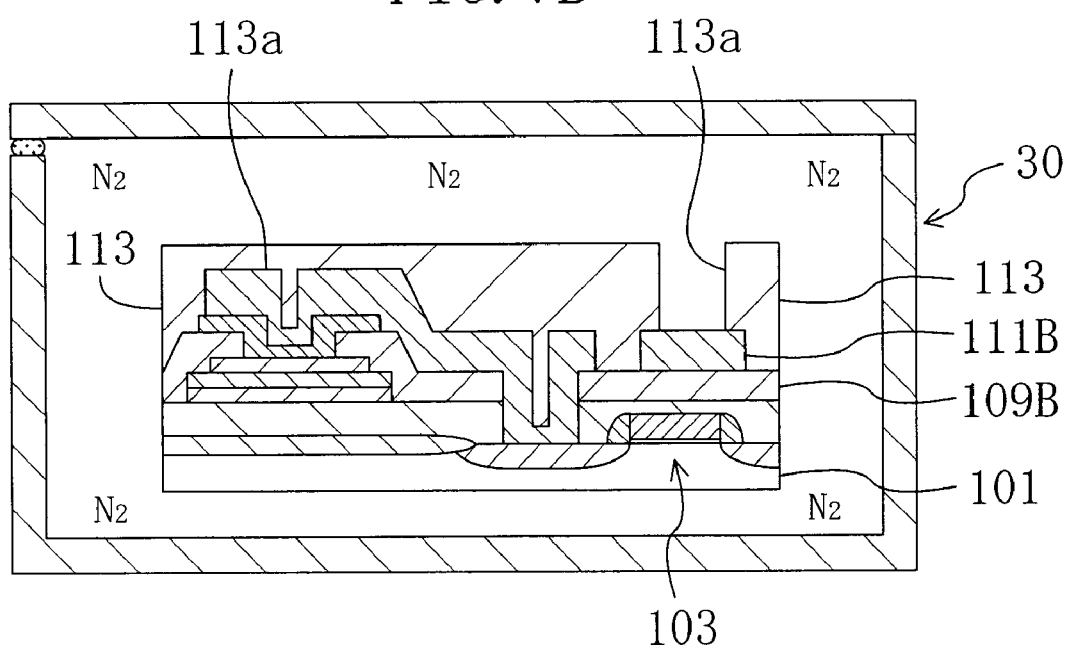

FIGS. 7A and 7B are schematic cross-sectional views for showing procedures in the method for fabricating a semiconductor device including a capacitor device having a capacitor dielectric film of a ferroelectric according to the modification of Embodiment 2. Herein, a difference from Embodiment 2 alone will be described. In FIGS. 7A and 7B, like reference numerals are used to refer to like elements shown in FIGS. 5B and 5C, so as to omit the description.

Third Interlayer Insulating Film Depositing Step

As shown in FIG. 7A, in a third interlayer insulating film depositing step, after taking out, from the first container 10, the wafer 101 on which the first interconnect 111B has been formed, a third interlayer insulating film 113 of silicon oxide with a thickness of approximately 1500 nm is deposited over the second interlayer insulating film 109B including the first interconnect 111B by the atmospheric pressure CVD in which TEOS is allowed to react with ozone, that is, an oxidant. Thereafter, the wafer 101 on which the third interlayer insulating film 113 has been deposited is contained in a third container 30 made of aluminum hermetically sealable. After containing the wafer 101, the atmosphere within the third container 30 is replaced with a nitrogen gas at a pressure of approximately 700×133.322 Pa, which is lower than the atmospheric pressure. Furthermore, the contact faces between a container body 30a and a roof 30b are hermetically sealed by adhering to each other with silicon rubber coated with vacuum grease, so as to be conveyed to a subsequent step.

In general, the third interlayer insulating film depositing step includes a variety of processing, and also during the convey time or the wait time between these various processing, namely, after completing the deposition of the third interlayer insulating film 113, the wafer 101 needs to be contained in the third container 30.

Third Interlayer Insulating Film Forming Step

Next, in a third interlayer insulating film forming step, the wafer 101 on which the third interlayer insulating film 113 has been deposited is taken out from the third container 30. Thereafter, as shown in FIG. 7B, the top face of the deposited third interlayer insulating film 113 is planarized by the resist etch back. Subsequently, a third contact hole 113a is selectively formed in the planarized third interlayer insulating film 113 so as to expose a portion of the first interconnect 111B disposed above the MOS transistor 103. Thereafter, the wafer 101 on which the third contact hole 113a has been formed is contained in the third container 30, so as to be conveyed to a subsequent step, namely, a second interconnect formation film depositing step. Also in this case, during the convey time or the wait time between the planarization of the third interlayer insulating film and the formation of the contact hole, the wafer 101 is contained in the third container 30.

In this manner, according to this modification, during the convey time or the wait time between the third interlayer insulating film depositing step and the second interconnect formation film depositing step, the third container 30 filled with a nitrogen gas is used. Therefore, the exposed portion of the third interlayer insulating film 113 of silicon oxide (ozone TEOS) is never exposed to the air. As a result, the remnant polarization value of the capacitor device 108 fabricated in this modification has been confirmed to increase from approximately 12 $\mu C/cm^2$ to approximately 16 $\mu C/cm^2$. Also, it has been confirmed that its retention characteristic is also increased by two or more figures.

Accordingly, the capacitor dielectric film 106 can be prevented from being damaged by moisture desorbed from the third interlayer insulating film 113 through the annealing performed in a nitrogen atmosphere at a temperature of approximately 400° C. in the second interconnect forming step.

The third interlayer insulating film forming step includes a variety of processing, and also during the convey time or the wait time between these various processing performed before completing the deposition of the second interconnect formation film 114A, the wafer 101 needs to be contained in the third container 30.

Embodiment 3

A method for fabricating a semiconductor device according to Embodiment 3 of the invention will now be described with reference to the accompanying drawings.

FIGS. 8A through 8C, 9A and 9B are cross-sectional views for showing procedures in the method for fabricating a semiconductor device including a capacitor device having a capacitor dielectric film of a ferroelectric according to Embodiment 3. In Embodiment 3, like reference numerals are used to refer to like elements described in Embodiment 1.

Capacitor Device Forming Step

Figure 8A:
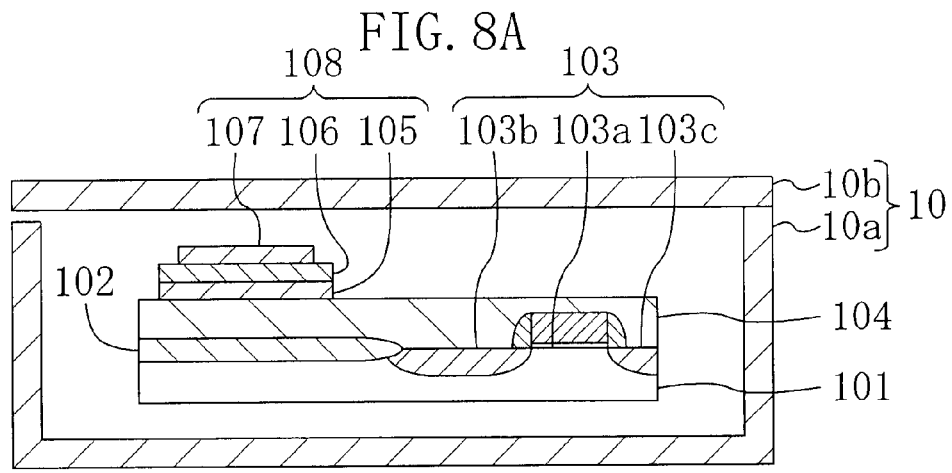
FIGS. 8A, 8B and 8C are schematic cross-sectional views for showing procedures in a method for fabricating a semiconductor device according to Embodiment 3 of the invention.

A capacitor device forming step shown in FIG. 8A will now be described.

First, in a transistor forming step prior to the capacitor device forming step, an isolation region 102 of a LOCOS film or the like is selectively formed in a wafer 101 of, for example, silicon. Thereafter, in a device formation region on the wafer 101 partitioned by the isolation region 102, a MOS transistor 103 including a gate electrode 103a, a source region 103b and a drain region 103c is formed. Subsequently, a first interlayer insulating film 104 of silicon oxide with a thickness of approximately 1500 nm is deposited over the wafer 101 including the isolation region 102 and the MOS transistor 103 by, for example, the CVD. Then, with a resist material applied over the irregular top face of the first interlayer insulating film 104, the top face of the first interlayer insulating film 104 is planarized by the resist etch back.

Next, a lower electrode formation film of platinum with a thickness of approximately 200 nm is deposited on the planarized first interlayer insulating film 104 by, for example, the spattering. Thereafter, a ferroelectric film of a metal oxide including strontium, bismuth and tantalum with a thickness of approximately 200 nm is deposited on the lower electrode formation film by, for example, the CVD, and an upper electrode formation film of platinum with a thickness of approximately 200 nm is deposited on the ferroelectric film. Subsequently, portions of the upper electrode formation film, the ferroelectric film and the lower electrode formation film disposed above the isolation region 102 are selectively and successively patterned by the lithography and the dry etching, thereby forming a lower electrode 105 from the lower electrode formation film, a capacitor dielectric film 106 from the ferroelectric film and an upper electrode 107 from the upper electrode formation film. In this manner, a capacitor device 108 composed of the lower electrode 105, the capacitor dielectric film 106 and the upper electrode 107 is obtained. Although merely one MOS transistor 103 and one capacitor device 108 are shown on the wafer 101 also in Embodiment 3, a plurality of MOS transistors 103 and a plurality of capacitor devices 108 are actually formed on the wafer 101. Subsequently, the capacitor device 108 is annealed in an oxygen atmosphere at a temperature of approximately 800° C., so as to recover damage of the capacitor dielectric film 106 having been caused by the dry etching in patterning the capacitor device 108. Thereafter, during a convey time when the wafer 101 is being conveyed to a fabrication system used for a subsequent step or a wait time before or after the conveyance, the wafer 101 on which the capacitor device 108 has been formed is contained in a conventional first container 10 of plastic, which is not sufficiently cut off from the outside atmosphere (the air).

In general, the capacitor device forming step includes a variety of processing, and also during the convey time or the wait time between these various processing, the wafer need not be contained in a container of the present invention but may be contained in the conventional first container 10.

Barrier Formation Film Depositing Step

Figure 8B:
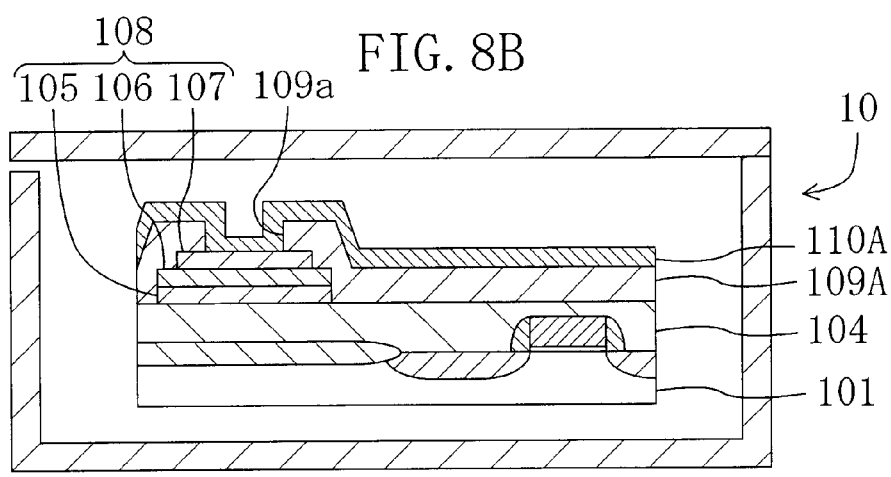

Next, in a barrier formation film depositing step, the wafer 101 on which the capacitor device 108 has been formed is taken out from the first container 101. Thereafter, as shown in FIG. 8B, a second interlayer insulating film 109A of silicon oxide including approximately 5% of phosphorus (P) (i.e., PSG) with a thickness of approximately 500 nm is deposited on the first interlayer insulating film 104 including the capacitor device 108 by the atmospheric pressure CVD.

Subsequently, a first contact hole 109a is formed in a portion of the second interlayer insulating film 109A disposed on the upper electrode 107 of the capacitor device 108 by the lithography and the dry etching. Thereafter, the annealing is performed in an oxygen atmosphere at a temperature of approximately 800° C., so as to recover damage of the capacitor dielectric film 106 having been caused by hydrogen ions generated during the deposition of the second interlayer insulating film 109A and caused by the dry etching in forming the first contact hole 109a. Subsequently, a barrier formation film 110A of titanium nitride with a thickness of approximately 50 nm is deposited over the second interlayer insulating film 109A including the bottom and the wall of the first contact hole 109a. Thereafter, the wafer 101 on which the barrier formation film 110A has been deposited is contained in the first container 10 to be conveyed to a subsequent step.

In general, the barrier formation film depositing step includes a variety of processing, and also during the convey time or the wait time between these various processing, the wafer need not be contained in the container of the present invention but may be contained in the conventional first container 10.

Barrier Film Forming Step and Interconnect Formation Film Depositing Step

Figure 8C:
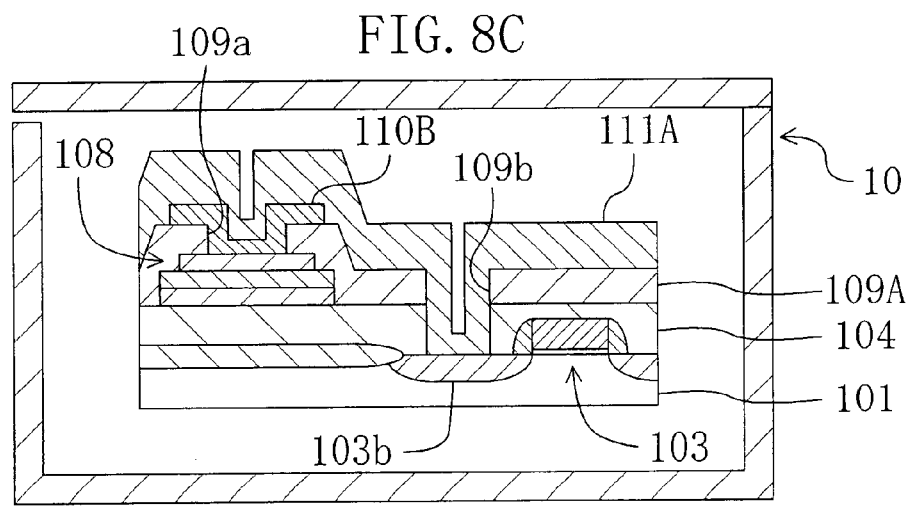

Next, in a barrier film forming step, the wafer 101 on which the barrier formation film 110A has been deposited is taken out from the first container 10. Thereafter, as shown in FIG. 8C, the barrier formation film 110A is patterned so as to allow a portion thereof including the first contact hole 109a to remain, thereby forming, from the barrier formation film 110A, a barrier film 110B that is electrically connected to the upper electrode 107 and protects the capacitor dielectric film 106. Subsequently, the wafer 101 on which the second interlayer insulating film 109A and the barrier film 110B have been formed is contained in the first container 10 to be conveyed to a subsequent step.

Next, in an interconnect formation film depositing step, the wafer 101 is taken out from the first container 10. Thereafter, a second contact hole 109b is formed in portions of the first interlayer insulating film 104 and the second interlayer insulating film 109A disposed above the source region 103b of the MOS transistor 103 by the lithography and the dry etching. Subsequently, titanium with a thickness of approximately 20 nm, titanium nitride with a thickness of approximately 100 nm, aluminum with a thickness of approximately 700 nm and titanium nitride with a thickness of approximately 50 nm are successively deposited over the second interlayer insulating film 109A including the bottom and the wall of the second contact hole 109b and the barrier film 110B by the sputtering. Thus, an interconnect formation film 111A with a four-layered structure in which the metal films and the metal nitride films are thus stacked is formed. Thereafter, the wafer 101 on which the interconnect formation film 111A has been formed is contained in the first container 10 to be conveyed to a subsequent step.

In general, the barrier film forming step and the interconnect formation film depositing step respectively include a variety of processing, and also during the convey time or the wait time between these various processing, the wafer 101 need not be contained in the container of the present invention but may be contained in the conventional first container 10.

Interconnect Forming Step

Figure 9A:
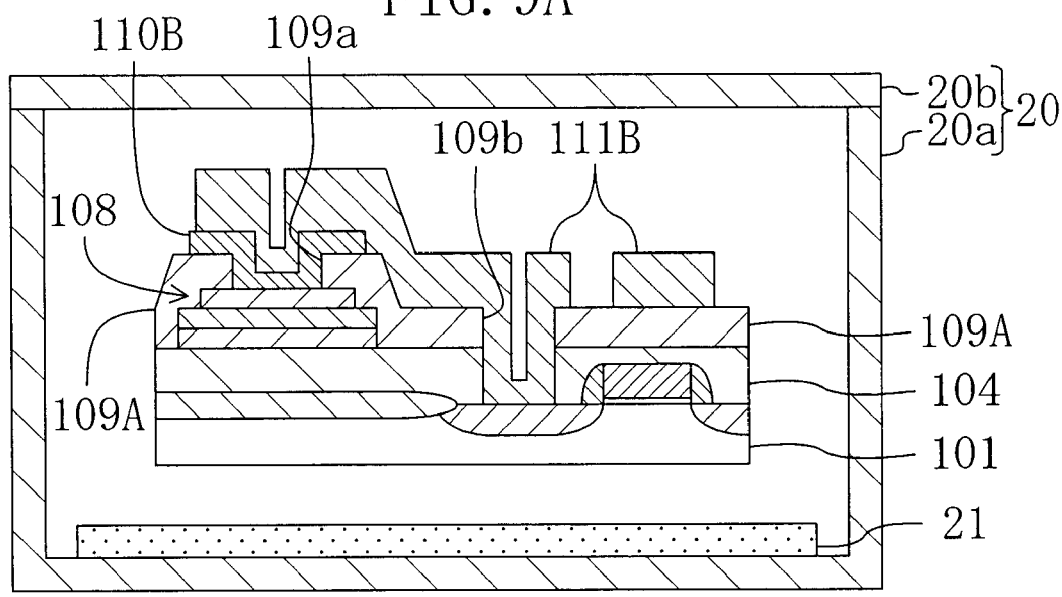
FIGS. 9A and 9B are schematic cross-sectional views for showing other procedures in the method for fabricating a semiconductor device of Embodiment 3.

Next, in an interconnect forming step, the wafer 101 on which the interconnect formation film 111A has been deposited is taken out from the first container 10. Thereafter, as shown in FIG. 9A, the interconnect formation film 111A is patterned by the dry etching so as to allow a portion thereof including the first contact hole 109a and the second contact hole 109b to remain, thereby forming an interconnect 111B from the interconnect formation film 111A. Thereafter, the wafer 101 on which the interconnect 111B has been patterned is contained in a second container 20 made of quartz to be hermetically sealable, to be conveyed to a subsequent step. Also in this case, after containing the wafer 101, the second container 20 is hermetically sealed by adhering the contact faces between a container body 20a and a roof 20b to each other with a vacuum grease material. Furthermore, the second container 20 is loaded with approximately 100 g of a moisture absorption material 21 that includes approximately 70% of pores and has been dried at a temperature of approximately 1200° C. In the subsequent step, that is, the annealing, the patterned interconnect 111B is annealed in an oxygen atmosphere at a temperature of approximately 450° C., so as to recover damage of the capacitor dielectric film 106 having been caused in depositing and patterning the interconnect formation film 111A. Through this annealing, remaining chloride included in an etching gas used for the dry etching of the interconnect formation film 111A is vaporized, and therefore, corrosion of the aluminum included in the interconnect 111B can be also prevented. Also after this, the wafer 101 on which the interconnect 111B has been formed is contained in the second container 20 to be conveyed to a subsequent step.

In general, the interconnect forming step includes a variety of processing, and also during the convey time or the wait time between these various processing, namely, after the face of the second interlayer insulating film 109A is exposed by patterning the interconnect 111B, the wafer 101 needs to be contained in the second container 20.

Protection Film Depositing Step

Figure 9B:
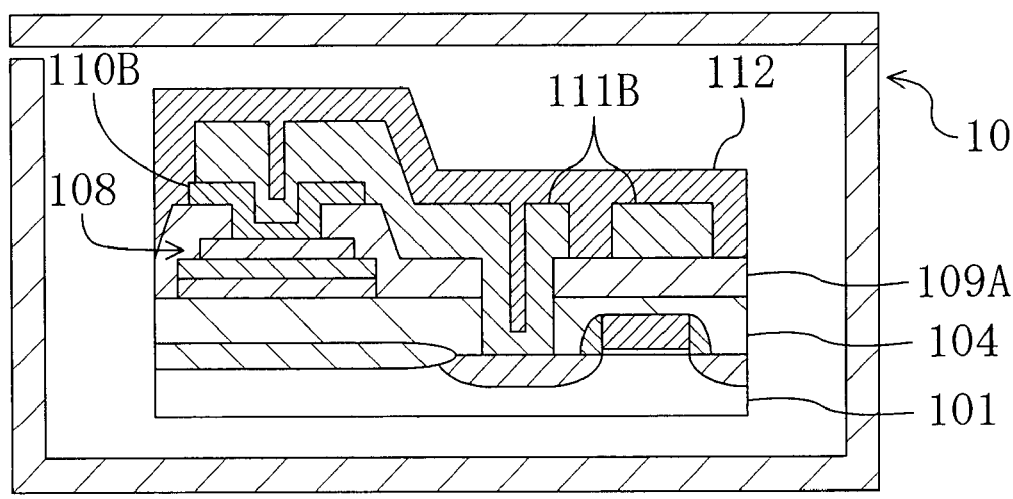

Next, in a protection film depositing step, the wafer 101 on which the interconnect 111B has been formed is taken out from the second container 20. Thereafter, as shown in FIG. 9B, a protection film 112 of silicon nitride with a thickness of approximately 800 nm is deposited over the second interlayer insulating film 109A including the interconnect 111B by the plasma CVD in which, for example, silane is used as a material and the substrate temperature is set to approximately 400° C. Thereafter, the wafer 101 on which the protection film 112 has been deposited is contained in the first container 10 to be conveyed to a subsequent step. Subsequently, although not shown in the drawings, a desired pad is formed in the protection film 112.

In general, the protection film depositing step includes a variety of processing, and also during the convey time or the wait time between these various processing, namely, after completing the deposition of the protection film 112, the wafer need not be contained in the container of the present invention but may be contained in the conventional first container 10.

As described so far, according to Embodiment 3 of the invention, during the convey time when the wafer is being conveyed from the interconnect forming step to the protection film depositing step or the wait time before or after this conveyance, the wafer 101 is contained in the hermetically sealed second container 20 loaded with the moisture absorption material 21 as shown in FIG. 9A. Therefore, the exposed portion of the second interlayer insulating film 109A of silicon oxide is never exposed to the air before depositing the protection film 112. Accordingly, the moisture absorbing function of the second interlayer insulating film 109A can be suppressed during the convey time or the wait time of the water 101.

Since the number of procedures is smaller in Embodiment 3 than in Embodiment 2, even when the conventional process is employed, the amount of moisture absorbed by the second interlayer insulating film 109A is small. However, in the case where the wait time between these steps is elongated due to a trouble of the fabrication system or the like, it is possible to reduce damage caused in the capacitor dielectric film 106 by moisture desorbed from the second interlayer insulating film 109A of silicon oxide (PSG) through the annealing of the interconnect 111B performed in an oxygen atmosphere at approximately 450° C. and through the formation of the protection film 112 performed at approximately 400° C.

The second container 20 may be used not only between the interconnect forming step and the protection film depositing step but also between other steps.

Also, the barrier film 110B electrically connected to the upper electrode 107 of the capacitor device 108 is formed not only in the portion above the capacitor device 108 but also in a portion below the interconnect 111B.

Modification of Embodiment 3

A method for fabricating a semiconductor device according to a modification of Embodiment 3 of the invention will now be described with reference to the accompanying drawing.

Figure 10:
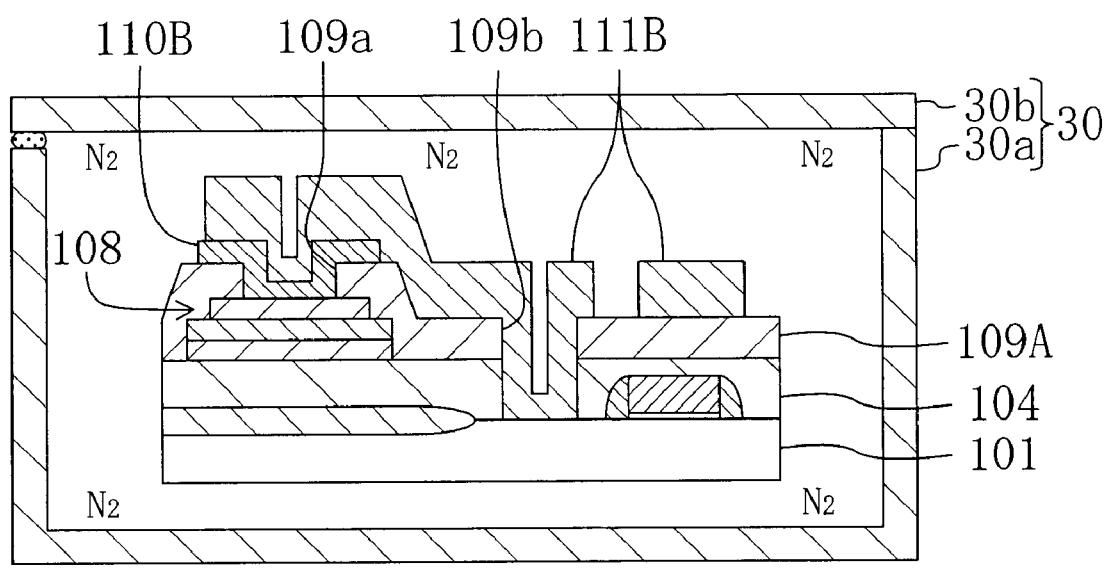
FIG. 10 is a schematic cross-sectional view for showing a procedure in a method for fabricating a semiconductor device according to a modification of Embodiment 3.
Figure 11:
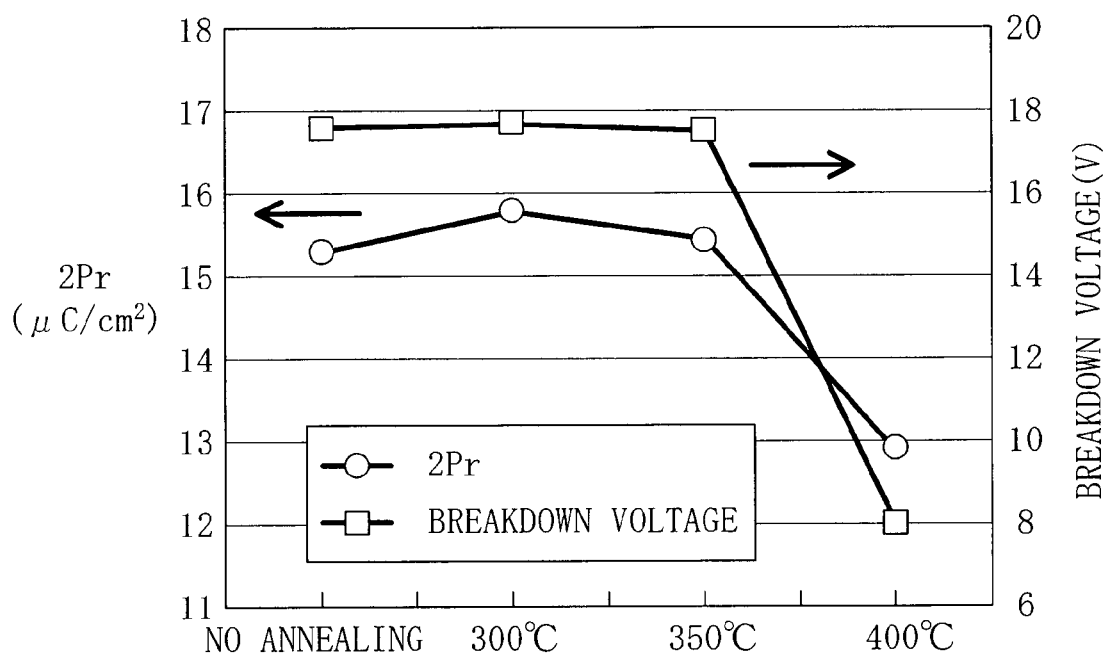
FIG. 11 is a graph for showing the dependency on the annealing temperature of the remnant polarization value and the breakdown voltage value of a conventional capacitor device including a capacitor dielectric film of a ferroelectric.
Figure 12:
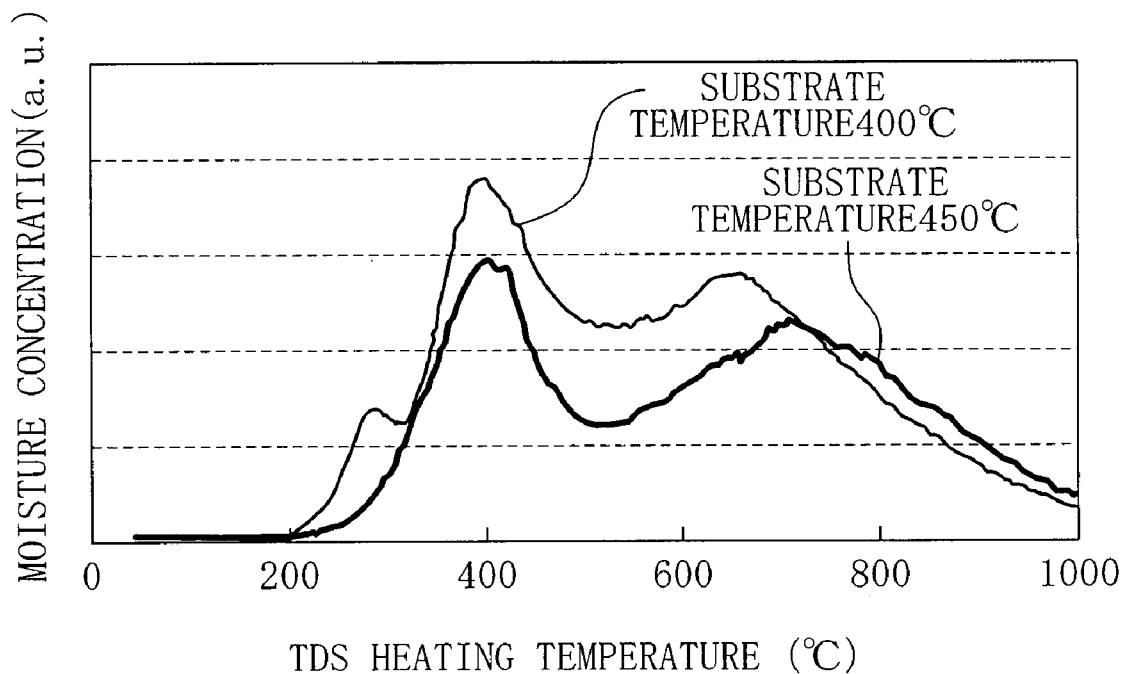
FIG. 12 is a graph for showing the dependency on the heating temperature of the concentration of moisture desorbed from silicon oxide obtained by thermal desorption spectroscopy.

FIG. 10 is a schematic cross-sectional view for showing a procedure in the method for fabricating a semiconductor device including a capacitor device having a capacitor dielectric film of a ferroelectric according to the modification of Embodiment 3. Herein, a difference from Embodiment 3 alone will be described. In FIG. 10, like reference numerals are used to refer to like elements used in FIG. 9A, so as to omit the description.

Interconnect Forming Step

As shown in FIG. 10, in an interconnect forming step, the wafer 101 on which the interconnect formation film 111A has been deposited is taken out from the first container 10. Thereafter, the interconnect formation film 111A is patterned by the dry etching so as to allow a portion thereof including the first contact hole 109a and the second contact hole 109b to remain, thereby forming an interconnect 111B from the interconnect formation film 111A. Thereafter, the wafer 101 on which the interconnect 111B has been patterned is contained in a third container 30 made of aluminum to be hermetically sealable. After containing the wafer 101, the atmosphere within the third container 30 is replaced with a nitrogen gas at a pressure of approximately 700×133.322 Pa, which is lower than the atmospheric pressure. Furthermore, the third container 30 is hermetically sealed by adhering the contact faces between a container body 30a and a roof 30b to each other with silicon rubber coated with vacuum grease, so as to be conveyed to a subsequent step. In the subsequent step, namely, the annealing, the patterned interconnect 111B is annealed in an oxygen atmosphere at a temperature of approximately 450° C., so as to recover damage of the capacitor dielectric film 106 having been caused in depositing and patterning the interconnect formation film 111A. Through this annealing, remaining chlorine included in the etching gas used in the dry etching of the interconnect formation film 111A is vaporized, and hence, corrosion of the aluminum included in the interconnect 111B can be also prevented. Also after this, the wafer 101 is contained in the third container 30 to be conveyed to the subsequent protection film depositing step.

In this manner, according to this modification, during the convey time or the wait time between the interconnect forming step and the protection film depositing step, the third container 30 filled with a nitrogen gas is used, and therefore, the exposed portion of the second interlayer insulating film 109A of silicon oxide is never exposed to the air. As a result, the amount of moisture absorbed by the exposed portion of the second interlayer insulating film 109A can be suppressed. Accordingly, the capacitor dielectric film 106 can be prevented from being damaged by moisture desorbed from the second interlayer insulating film 109A through the annealing performed in an oxygen atmosphere at a temperature of approximately 450° C. in the interconnect forming step.

In general, the interconnect forming step includes a variety of processing, and also in this modification, during the convey time or the wait time between these various processing performed after the formation of the interconnect 111B until completion of the deposition of the protection film 112, the wafer 101 needs to be contained in the third container 30.

Although the ferroelectric including strontium (Sr), bismuth (Bi) and tantalum (Ta) is used as the capacitor dielectric film 106 in each of Embodiments 1 through 3 and their modifications, the material for the capacitor dielectric film is not limited to this ferroelectric. Specifically, the same effect can be attained when the capacitor dielectric film is made of a ferroelectric or high dielectric metal oxide such as a layered perovskite composite oxide including bismuth (Bi); a perovskite composite oxide including lead (Pb), zirconium (Zr) and titanium (Ti); or a perovskite composite oxide including strontium (Sr) and titanium (Ti).

Also, as the interlayer insulating films made of an oxide that absorbs or desorbs moisture during the fabrication, the second interlayer insulating film 109A is made of silicon oxide including phosphorus (PSG) and the third interlayer insulating film 113 is made of silicon oxide of ozone TEOS. Apart from these silicon oxides, the damage of the capacitor dielectric film 106 can be effectively prevented in using an oxide in which a bond to oxygen is changed to a hydroxy bond through a reaction with water or a compound capable of coordinately bonding to water because such an oxide or compound absorbs and desorbs moisture.

Although the multilayer film including titanium, titanium nitride and aluminum is used as the interconnect formation film 111A or 114A, the same effect can be attained by using any conducting material that neither reacts with nor bonds to water, such as tungsten (W) and copper (Cu). Also in this case, a metal or a metal nitride may be singly used or a multilayer film including two or more of metals and metal nitrides may be used.

Although the moisture absorption material 21 loaded in the second container is silica gel, any material that has a moisture absorbing property and does not cause any problem like contamination in the wafer 101, such as active alumina, may be used for attaining the same effect.

Although the third container 30 is filled with nitrogen, it may be filled with an argon (Ar) gas or a helium (He) gas instead of the nitrogen. Alternatively, if the third container 30 has sufficiently high mechanical strength, it may be evacuated.

What is claimed is:

1. A method for fabricating a semiconductor device comprising:
 a step of forming, on a substrate, a capacitor device including a capacitor dielectric of a metal oxide,
 wherein, during a convey time when said substrate on which said capacitor device has been formed is being conveyed to a subsequent step following the step of forming a capacitor device or during a wait time before or after conveying said substrate form the step of forming a capacitor device to the subsequent step, said substrate on which said capacitor device has been formed is contained in a container having an atmosphere within which has a lower moisture concentration than the ambient atmosphere.

2. The method for fabricating a semiconductor device of claim 1, wherein said container is hermetically sealable and is loaded with a moisture absorption material.

3. The method for fabricating a semiconductor device of claim 2, wherein said moisture absorption material is made of silica gel or active alumina.

4. The method for fabricating a semiconductor device of claim 1, wherein said container is hermetically sealable and is filled with an inert gas or is kept evacuated.

5. The method for fabricating a semiconductor device of claim 4, wherein said inert gas is nitrogen, argon or helium.

6. The method for fabricating a semiconductor device of claim 1, wherein said metal oxide is a layered perovskite composite oxide including bismuth or a perovskite composite oxide including lead, zirconium and titanium, or strontium and titanium.

* * * * *